(12) United States Patent
Behrens et al.

(10) Patent No.: US 7,905,275 B2
(45) Date of Patent: Mar. 15, 2011

(54) CERAMIC FOAM COLD PLATE

(75) Inventors: William W. Behrens, St. Louis, MO (US); Andrew R. Tucker, Glendale, MO (US)

(73) Assignee: The Boeing Company, Chicago, IL (US)

( * ) Notice: Subject to any disclaimer, the term of this patent is extended or adjusted under 35 U.S.C. 154(b) by 237 days.

(21) Appl. No.: 11/407,438

(22) Filed: Apr. 20, 2006

(65) Prior Publication Data

US 2007/0247812 A1 Oct. 25, 2007

(51) Int. Cl.
*F28F 7/02* (2006.01)

(52) U.S. Cl. .................. 165/80.4; 165/80.5; 361/699

(58) Field of Classification Search ............ 165/80.4, 165/80.5; 361/699
See application file for complete search history.

(56) References Cited

U.S. PATENT DOCUMENTS

| | | | |
|---|---|---|---|
| 3,307,616 A * | 3/1967 | Giger | 165/134.1 |
| 3,452,553 A * | 7/1969 | Dershin et al. | 165/60 |
| 3,880,969 A | 4/1975 | Latos | |
| 4,884,169 A * | 11/1989 | Cutchaw | 361/700 |
| 5,388,635 A * | 2/1995 | Gruber et al. | 165/80.4 |
| 5,978,220 A * | 11/1999 | Frey et al. | 361/699 |
| 6,478,082 B1 | 11/2002 | Li | |
| 6,958,912 B2 * | 10/2005 | Pokharna et al. | 361/700 |
| 7,044,199 B2 * | 5/2006 | Thayer et al. | 165/80.4 |
| 7,501,111 B2 * | 3/2009 | Keller et al. | 423/573.1 |
| 2004/0104022 A1 * | 6/2004 | Kenny et al. | 165/299 |
| 2004/0132607 A1 * | 7/2004 | Wood et al. | 501/95.1 |
| 2004/0182548 A1 | 9/2004 | Lovette et al. | |
| 2004/0245373 A1 * | 12/2004 | Behrens et al. | 244/10 |
| 2005/0269061 A1 * | 12/2005 | Brewer et al. | 165/80.4 |
| 2006/0141413 A1 * | 6/2006 | Masten et al. | 431/328 |
| 2006/0157225 A1 * | 7/2006 | Martin et al. | 165/80.4 |
| 2007/0095507 A1 * | 5/2007 | Henderson et al. | 165/104.26 |

FOREIGN PATENT DOCUMENTS

| | | |
|---|---|---|
| EP | 1263040 A | 12/2002 |
| WO | WO 99/52838 * | 10/1999 |
| WO | 99/66279 A2 | 12/1999 |
| WO | 2004/108531 A1 | 12/2004 |

OTHER PUBLICATIONS

Haack, David, Kenneth Butcher, T. Kim and T. J. Lu, Novel Lightweight Metal Foam Heat Exchangers, pp. 1-7, University of Cambridge, Cambridge, UK, Nov. 2001.*

(Continued)

*Primary Examiner* — Teresa J Walberg
(74) *Attorney, Agent, or Firm* — Toler Law Group, IP

(57) ABSTRACT

An exemplary cold plate housing defines an inlet port and an outlet port. A plurality of foam strips are disposed in the housing. Each foam strip suitably has pore size of no more than around 50 micrometers and porosity of at least around 80 percent. The foam strips are arranged within the housing so coolant is flowable through a width of the foam strips. Pore size may be around 35 micrometers and porosity may be around ninety percent. Foam may be a ceramic foam that includes silica, aluminum oxide, and aluminum borosilicate fibers. A plurality of plenums may be disposed within the housing. In an application, at least one exemplary cold plate is disposed within a heat exchanger housing intermediate a heat exchanger inlet port and a heat exchanger outlet port such that heat exchanger fluid flows directly over both sides of the cold plate.

27 Claims, 8 Drawing Sheets

OTHER PUBLICATIONS

"Rarefied", definition from Oxford English Dictionary Online, Oxford University Press, 2009.*

"Rarefaction", definition from Oxford English Dictionary Online, Oxford University Press, 2009.*

IEEE Transactions on Components and Packaging Technologies, vol. 26, No. 1, Mar. 2003, "Thermal Performance of Aluminum-Foam Heat Sinks by Forced Air Cooling", Kim et al., pp. 262-267.

Examination Report under Section 18(3) for Application No. GB0706419.9, dated Jun. 9, 2008.

* cited by examiner

CERAMIC FOAM COLD PLATE

BACKGROUND

Integrated circuit chips, such as micro-processor chips, and other electronic components generate heat during operation. These components are generally mounted on printed circuit boards (PCBs). To help ensure proper operation, these components generally are kept at an operating temperature below around 160° F. This means that cooling of some sort must be provided for proper operation of electronic components.

Cold plates are widely used for cooling PCBs where the coolant must be kept separated from the electronic components. A cold plate generally consists of an enhanced heat transfer surface encapsulated in a high aspect ratio rectangular duct. The enhanced heat transfer surfaces are typically some sort of fin arrangement or an open-celled, porous metal foam. Coolant flows through the cold plate from one end to the other end, completely wetting the enhanced heat transfer surface inside. This system cools PCBs mounted to the sides of the cold plate. Finned core stocks and metal foams are used in cold plates because they increase the thermal effectiveness by increasing the surface area available for transferring heat to the coolant. However, surface area densities for finned core stock and metal foams are generally limited to approximately 1000 $ft^2/ft^3$. This is chiefly because surface area densities significantly larger than this value result in unacceptably high pressure drop as the coolant flow through the cold plate. High pressure drop translates into a system penalty in the form of higher power required for pushing the coolant through the cold plate. Furthermore, manufacturing fin and metal foam arrangements with higher surface area densities becomes increasingly costly and complex. These limitations on surface area density ultimately limit the heat that can be absorbed for given coolant flowrate. Such a limitation will be exacerbated by introduction in the future of high power electronics because conventional air cooled cold plates will not be able to address cooling of future high power electronics. This is because these chips are projected to generate significantly more heat than contemporary chips while still having an operating temperature limit of around 160° F.

One of several possible applications for cold plates includes cooling PCBs found in avionics units on aircraft. Avionics cooling on aircraft is commonly provided by blowing cooled, conditioned air through cold plate heat sinks. However, generation of this cooling air by an aircraft environmental control system (ECS) constitutes a system performance penalty for the aircraft. This is because the ECS generates cooling air by extracting air from the aircraft's engine and cooling it with ram air ducted into the vehicle from outside. Extracting air from the engine reduces the air available for generating thrust while capturing ram air increases aircraft drag. These effects ultimately reduce range and/or payload for an aircraft.

Therefore, it would be desirable to reduce the amount of air required to cool avionics, thereby reducing the system performance penalty for an air vehicle by increasing vehicle thrust and/or lowering fuel consumption. It would also be desirable to address cooling of future high power electronics that are projected to generate significantly more heat than contemporary chips while still having an operating temperature limit of around 160° F.

The foregoing examples of related art and limitations associated therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems and methods which are meant to be exemplary and illustrative, not limiting in scope. In various embodiments, one or more of the problems described above in the Background have been reduced or eliminated, while other embodiments are directed to other improvements.

In an exemplary cold plate, a housing defines an inlet port and an outlet port, and a plurality of foam strips are disposed in the housing. Each of the foam strips suitably has a pore size of no more than around 50 micrometers and a porosity of at least around 80 percent. The plurality of foam strips is arranged within the housing such that coolant is flowable through a width of the foam strips.

According to an aspect, the pore size may be around 35 micrometers. Also, the porosity may be around ninety percent. An exemplary foam may be a ceramic foam, such as a hyperporous, microchannel alumina silica ceramic foam that includes silica, alumina, and aluminum borosilicate fibers.

According to another aspect, a plurality of plenums may be disposed within the housing. Each of the plenums may be defined by a pair of adjacent foam strips. In such an arrangement, a first end plate is attached to first ends of the pair of adjacent foam strips and a second end plate is attached to a second end of one of the pair of adjacent foam strips.

In another exemplary cold plate, a housing defines first and second inlet ports and first and second outlet ports, and first and second pluralities of foam strips are disposed in the housing. Each of the foam strips has a pore size of no more than around 50 micrometers and a porosity of at least around 80 percent. The first and second pluralities of foam strips are arranged within the housing such that coolant from the first inlet is flowable through widths of the foam strips in the first plurality of foam strips and coolant from the second inlet is flowable through widths of the foam strips in the second plurality of foam strips. Flows from the first and second pluralities of foam strips meet in mid-plane of the cold plate, split, and exit out the first and second outlet ports.

In an advantageous application of an exemplary cold plate, a heat exchanger includes a heat exchanger housing that defines at least one heat exchanger inlet port for a first fluid and at least one heat exchanger outlet port for the first fluid. At least one exemplary cold plate is disposed within the heat exchanger housing intermediate the heat exchanger inlet port and the heat exchanger outlet port such that the first fluid flows over one surface of the cold plate and then an opposite surface of the cold plate. The exemplary cold plate includes a cold plate housing defining at least a first cold plate inlet port for a second fluid and at least a first cold plate outlet port for the second fluid, and at least a first plurality of foam strips disposed in the cold plate housing. Each of the foam strips has a pore size of no more than around 50 micrometers and a porosity of at least around 80 percent. The foam strips are arranged within the cold plate housing such that the second fluid is flowable through a width of the foam strips.

In addition to the exemplary embodiments and aspects described above, further embodiments and aspects will become apparent by reference to the drawings and by study of the following detailed description.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DETAILED DESCRIPTION

Figure 1A:
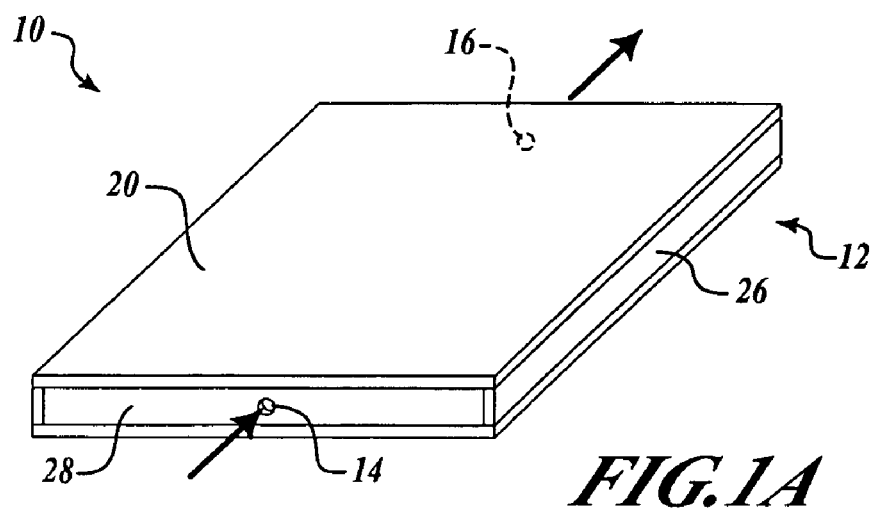
FIG. 1A is a perspective view of an exemplary ceramic foam cold plate.
Figure 1B:
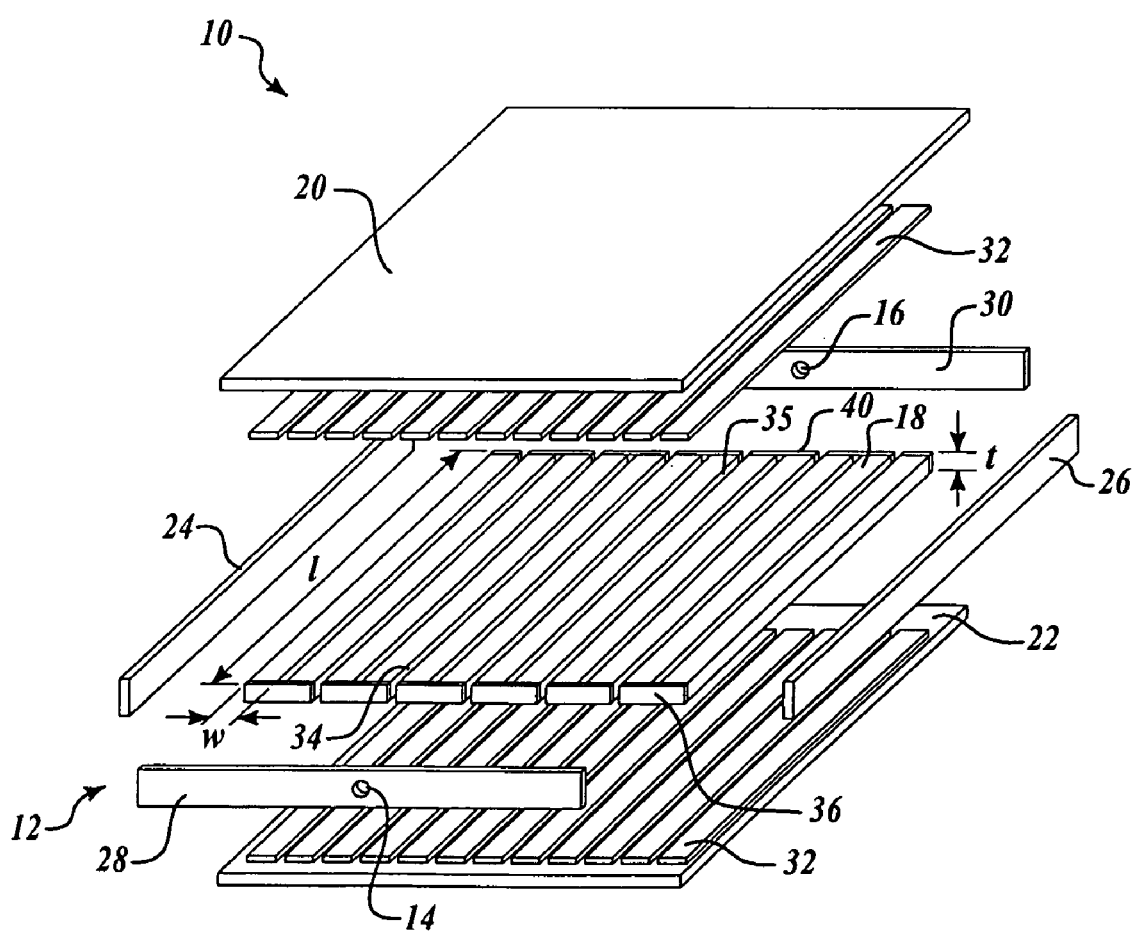
FIG. 1B is an exploded perspective view of the exemplary ceramic foam cold plate of FIG. 1A.

By way of overview and referring to FIGS. 1A and 1B, in an exemplary cold plate 10, a housing 12 defines an inlet port 14 and an outlet port 16, and a plurality of foam strips 18 are disposed in the housing 12. Each of the foam strips 18 suitably has a pore size of no more than around 50 micrometers and a porosity of at least around 80 percent. The plurality of foam strips 18 is arranged within the housing 12 such that coolant flows through a width w of the foam strips 18. Details of exemplary embodiments and applications will be set forth below.

Still referring to FIGS. 1A and 1B, the housing 12 is made of top and bottom cover plates 20 and 22, side plates 24 and 26, and end plates 28 and 30. The end plate 28 defines the inlet port 14 for receiving the coolant, such as cooling air, from a source (not shown) of the coolant. In an exemplary application, the source of cooling air suitably is an aircraft ECS. The end plate 30 defines the outlet port 16 for discharging the coolant from the cold plate 10. Given by way of non-limiting example, in an exemplary embodiment the housing 12 is made of aluminum. However, the housing 12 suitably is made of any lightweight material with acceptable heat transfer properties as desired for a particular application. Other examples of materials from which housing 12 could be constructed include copper, silicon, or a polymer.

In an exemplary embodiment, a thermal sealant 32 is interposed in physical contact between the top cover plate 20 and the foam strips 18 and between the bottom cover plate 22 and the foam strips 18. The thermal sealant 32 physically connects the foam strips 18 to the top cover plate 20 and bottom cover plate 22. The thermal sealant 32 ensures all coolant flows through the foam strips 18 rather than between the top cover plate 20 and the foam strips 18 and the bottom cover plate 22 and the foam strips 18. Given by way of non-limiting example, in one exemplary embodiment the thermal sealant 32 is a room temperature vulcanizing (RTV) silicone. However, the thermal sealant 32 suitably may be any thermal sealant with thermal conductivity characteristics that are acceptable for a particular application as desired. Another non-limiting example of thermal sealant 32 is a conductive epoxy.

Figure 1C:
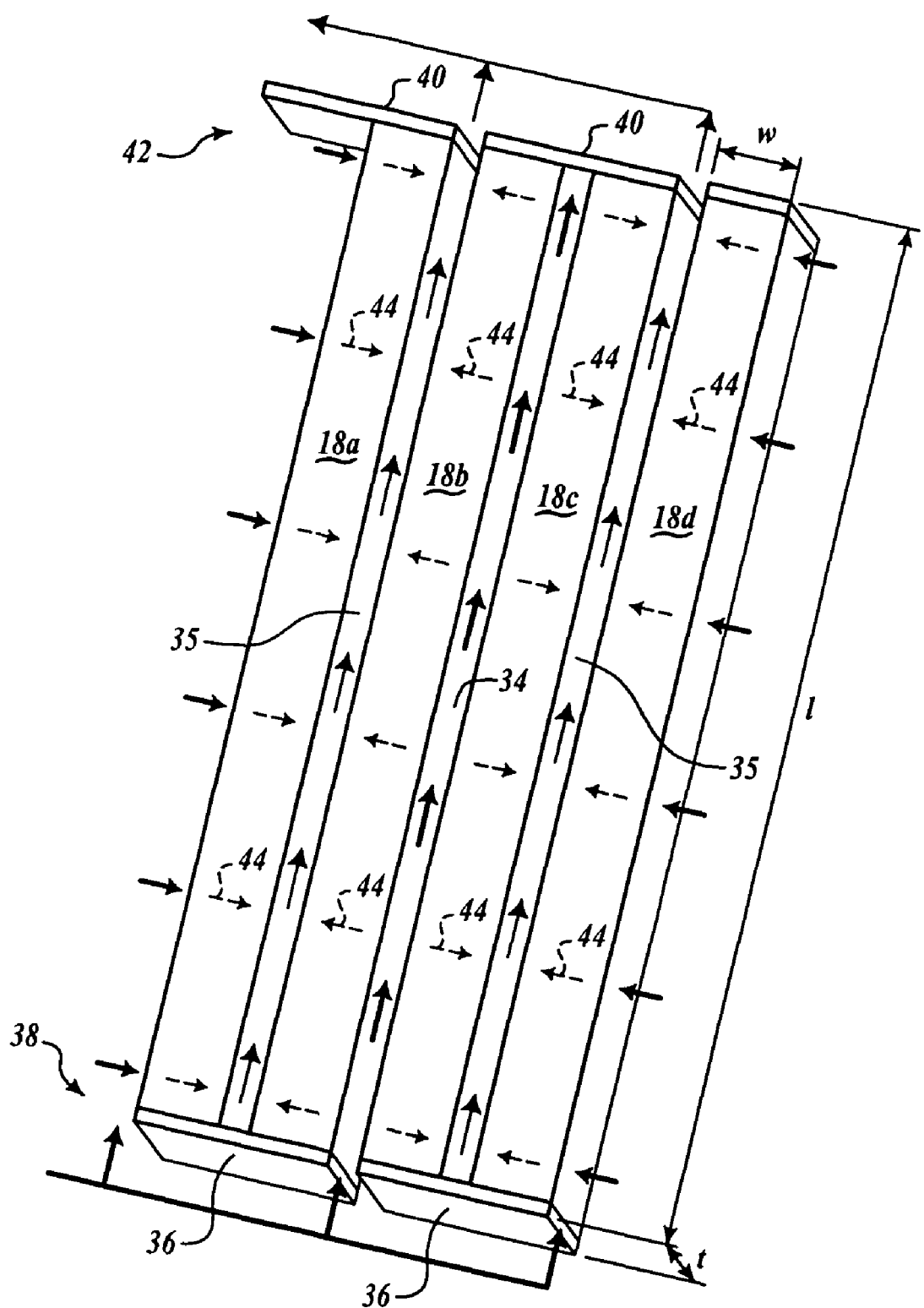
FIG. 1C illustrates details of features of the exemplary ceramic foam cold plate of FIGS. 1A and 1B.

Referring additionally to FIG. 1C, the foam strips 18 transfer heat to the coolant that flows through the foam strips 18. The foam strips 18 may have any dimensions as desired for a particular application. Given by way of non-limiting example, the foam strips 18 may have a length l of approximately around one-and-a-half feet. In one exemplary embodiment, the length l is on the order of around 17 inches. The foam strips 18 may have a thickness t on the order of less than approximately one inch. In one exemplary embodiment, the thickness t is on the order of around one fourth of an inch. The foam strips 18 may have a width w on the order of less than one inch or so. In one exemplary embodiment, the width w is on the order of around one fourth of an inch. Because the coolant flows through the foam strips 18 through the width w, the width w represents the cooling length—that is, the length the coolant flows through the foam strips 18 during which the majority of heat is transferred to the coolant. Additional heat may be transferred to the coolant as the coolant scrubs the top cover plate 20 and bottom cover plate 22 as it flows through the outlet plenums 35 towards the outlet port 16.

The foam strips 18 are arranged within the housing 12 in such a manner as to create several inlet plenums 34 and outlet plenums 35. The inlet plenums 34 and the outlet plenums 35 provide several channels for coolant to flow into and out of the several foam strips 18, respectively, thereby advantageously helping to reduce pressure drop across the cold plate 10. In an exemplary embodiment, the pressure drop across the cold plate 10 is merely on the order of inches of water when air is used as the coolant. As shown in FIG. 1C, an end cap 36 is attached to adjacent foam strips 18a and 18b at an end 38 of the foam strips 18. An end cap 36 is also attached to adjacent foam strips 18c and 18d at the end 38. An end cap 40 is attached to the foam strip 18a (but not the foam strip 18b) at an end 42 of the foam strips 18. An end cap 40 is also attached to the adjacent foam strips 18b and 18c at the end 42. Finally, an end cap 40 is attached to the foam strip 18d at the end 42.

The coolant flows from the inlet port 14 toward the foam strips 18. The flow of the coolant is blocked by the end caps 36. Therefore, the coolant is channeled into the inlet plenums 34. The end cap 40 prevents the coolant from exiting the inlet plenum 34. Therefore, the coolant is forced through the width w of the foam strips 18 as indicated by arrows 44. After the coolant has flowed through the width w of the foam strips 18, the coolant exits the foam strips 18 into the outlet plenums 35. The end caps 36 prevent the coolant from exiting the outlet plenums 35. Therefore, the coolant exits the outlet plenums 35 to the outlet port 16, from which the coolant is discharged from the cold plate 10.

Advantageously, the foam strips 18 are made of material that has a small pore size as well as high porosity. The pore size suitably is on the order of no more than around 50 micrometers or so. Given by way of non-limiting example, in one exemplary embodiment the pore size is on the order of around 35 micrometers. The material is also suitably hyperporous. To that end, porosity is on the order of at least around 80 percent or so. Given by way of a non-limiting example, in one exemplary embodiment porosity is on the order of around 90 percent.

A small pore size as described above greatly increases internal surface area-to-volume ratio, or surface area density, of the material of the foam strips 18. Therefore, this surface area-to-volume ratio greatly increases heat transfer capability of the foam strips 18. Because the pore size of the material of the foam strips 18 is more than an order of magnitude smaller than pore size of materials currently used in conventional metal foam cold plates, the internal surface area-to-volume ratio of the foam strips 18 is more than an order of magnitude greater than that for currently known metal foam cold plates—even though porosity may be comparable. As a result, the heat transfer area internal to the foam strips 18 advantageously is more than an order of magnitude greater than that for materials used in currently known metal foam cold plates.

Advantageously, use of the several foam strips 18 and the several inlet plenums 34 and outlet plenums 35 overcomes the higher coolant pressure loss associated with small pore sizes. Pressure losses associated with the foam strips 18 advantageously are mitigated by minimizing the cooling length—that is, the width w of the foam strips 18—while maximizing the number of the foam strips 18 and/or their length l. Thus, the cold plate 10 takes advantage of the small pore size of the foam strips 18 that greatly increase internal heat transfer surface area while overcoming the higher pressure loss related to small pore sizes. As a result, pressure drop across the cold plate 10 is comparable to pressure drop across currently known metal foam or finned cold plates.

Therefore, in contrast to conventional cold plates, the cold plate 10 advantageously reduces the amount of cooling air required to cool contemporary avionics. This, in turn, reduces the avionics cooling penalty for an air vehicle, thereby increasing vehicle thrust and/or lowering fuel consumption. Alternately, a smaller ECS can be used, thereby reducing weight and fuel burn. In addition, the cold plate 10 advantageously can address the cooling of future high power electronics. These chips are projected to generate significantly more heat than contemporary chips while maintaining an operating temperature limit of approximately 160° F. The cold plate 10 could cool these chips using the same amount of air that currently known cold plates use for lower power contemporary chips. This would then preclude the need for using more complicated and heavier liquid cooling systems.

Figure 2:
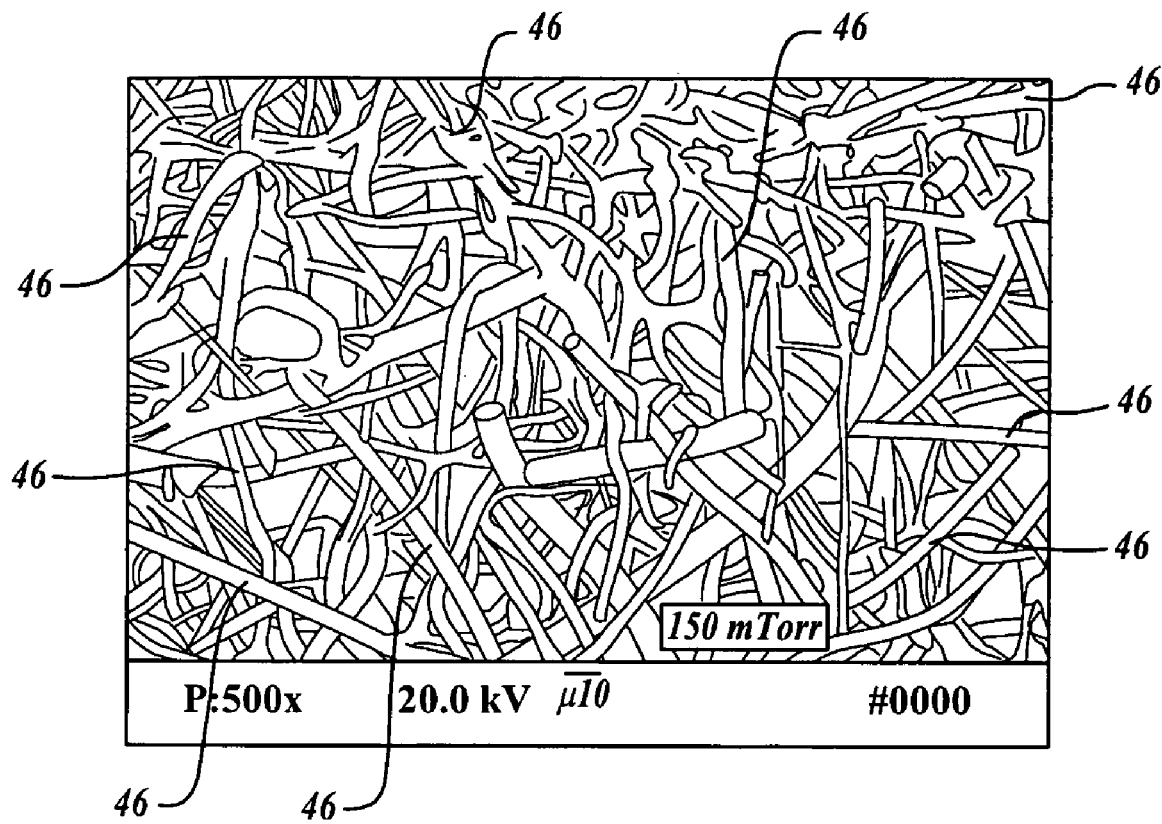
FIG. 2 illustrates pore size of exemplary ceramic foam.

The foam strips 18 may be made of any acceptable material that combines small pore size and hyperporosity as described above. Given by way of non-limiting example, ceramic foam suitably is used as the material for the foam strips 18. In one exemplary and non-limiting embodiment, a ceramic foam that is especially well-suited for the foam strips 18 is a hyperporous, microchannel (that is, small pore size on the order of around 35 micrometers) alumina silica ceramic foam that includes up to around 68 percent silica, around 20 percent alumina, and around 12 percent alumina borosilicate fibers. One example of such an exemplary ceramic foam is Alumina Enhanced Thermal Barrier (AETB), made by The Boeing Company, Huntington Beach, Calif. FIG. 2 illustrates an electron micrograph of fibers 46 of AETB, indicating a pore size on the order of around 35 micrometers.

Figure 3A:
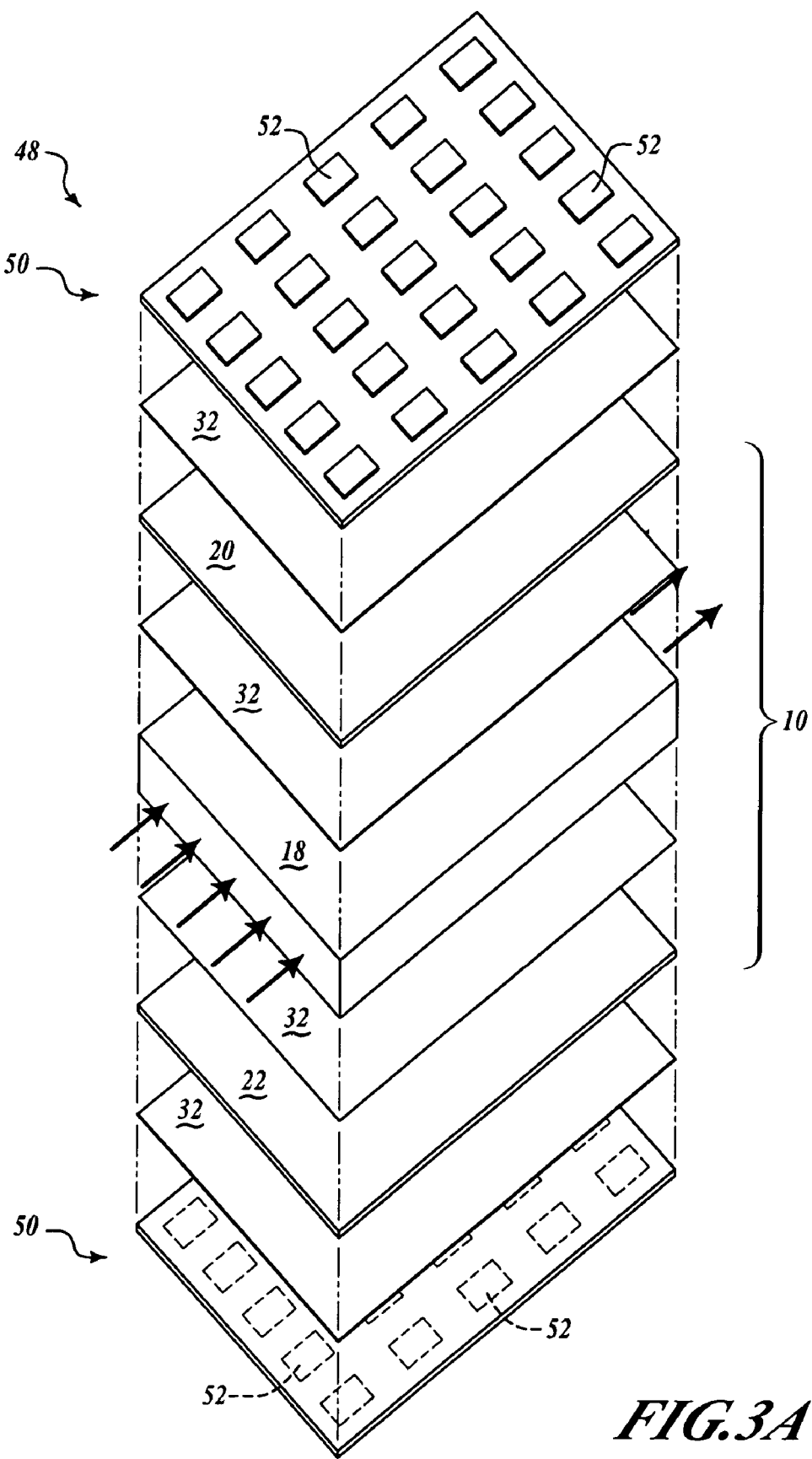
FIGS. 3A and 3B are perspective views of exemplary circuit board assemblies cooled with a cold plate.
Figure 3B:
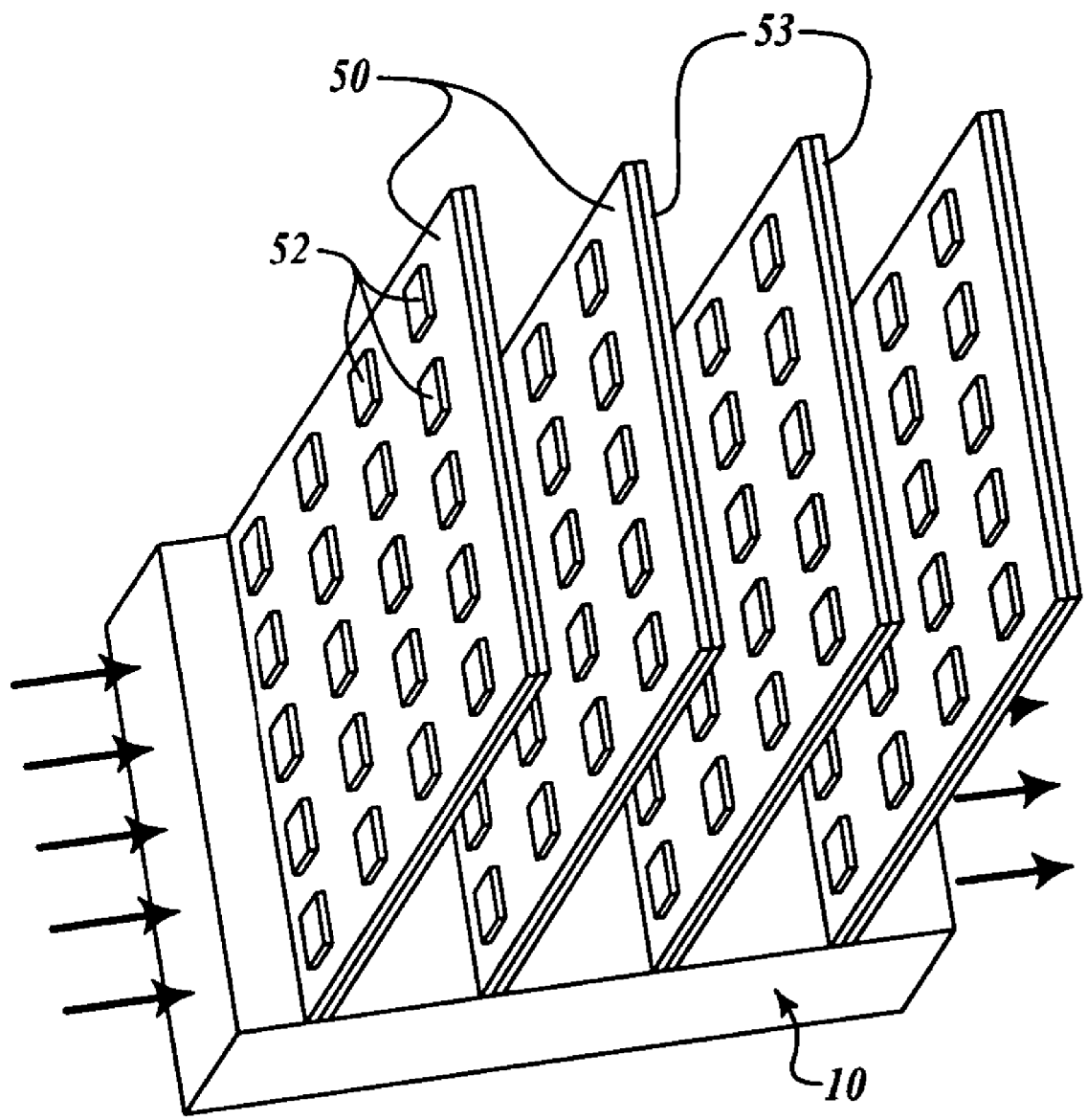

The cold plate 10 is especially well-suited for cooling circuit board assemblies. Referring now to FIG. 3A, a circuit board assembly 48 includes at least one printed circuit board 50 having first and second sides. Printed circuits 52 are mounted on the first side of the printed circuit board 50. The second side of the printed circuit board 50 is bonded to the top cover plate 20 (for one of the printed circuit boards 50) or the bottom cover plate 22 (for the other printed circuit board 50) using the thermal sealant 32. Referring now to FIG. 3B, in another exemplary arrangement the cold plate 10 is well suited for cooling multiple printed circuit boards 50. The printed circuit boards 50 are mounted to heat spreaders 53. Heat dissipated to the heat spreaders 53 is conducted to the cold plate 10 since the heat spreaders 53 are in thermal contact with the cold plate 10.

The advantageous heat transfer characteristics and flow properties of the cold plate 10 and the foam strips 18 (FIGS. 1A-1C) have been validated during testing. The internal convective heat transfer coefficient, denoted as h, that corresponds to a nominal set of test conditions from an AETB ceramic foam cold plate test was quantified by a heat transfer analysis. The internal convective heat transfer coefficient needed to achieve an average top cover plate temperature and bottom cover plate temperature of 122° F. was determined for AETB foam and a conventional metal foam DUOCEL. AETB ceramic foam with a porosity of 0.9 and an average pore size of 35 micrometers has a thermal conductivity of 0.05 BTH/hr-ft-degree R and an internal surface area-to-volume ratio of 31,350 ft$^2$/ft$^3$. Conversely, DUOCEL metal foam with a porosity of 0.9 and an average pore size of 508 micrometers has a thermal conductivity of 5.6 BTH/hr-ft-degree R and an internal surface area-to-volume ratio of only 860 ft$^2$/ft$^3$. The internal convective heat transfer coefficient was determined according to the relationship $$Q = h_{conv} A (122° F. - 70° F.) \quad (1)$$

where Q=177 W; and $T_{top\ and\ bottom\ cover\ plates} = 122°$ F.
$T_{Coolant} = 70°$ F.

The results of the analysis are shown below in Table 1.

TABLE 1

| Foam Thickness (in) | $A_{DUOCEL}/A_{AETB}$ | $h_{DUOCEL}/h_{AETB}$ |
|---|---|---|
| 0.25 | 0.03 | 11.5 |
| 0.75 | 0.03 | 4.2 |

The high internal surface area of the AETB ceramic foam more than offsets its low thermal conductivity. The h value needed for the DUOCEL metal foam was 11.5 times greater than that needed for the AETB ceramic foam. A higher coolant flow rate is needed to produce a higher h value. Therefore, a significantly higher coolant flow rate would be required for a DUOCEL metal foam cold plate compared to the cold plate 10. Thus, the cold plate 10 provides superior avionic cooling performance compared to a metal foam cold plate, because the lower coolant flow rate translates into a lower air vehicle penalty.

Testing was also performed on a conventional back side convection avionics cold plate for comparison to an AETB ceramic foam cold plate. The AETB ceramic foam cold plate used a continuous piece of foam instead of foam strips. Aluminum plates were bonded to both sides of the AETB cold plate to allow attachment of conduction heaters for simulating the avionics PCB heat load (158 W Total). The conventional cold plate was a high aspect ratio duct through which coolant was passed. Conduction heaters were also bonded to both sides of the conventional cold plate to simulate the avionics load (158 W Total). Testing was done with a single upstream plenum feeding one end of the cold plate and a single coolant outlet. Both the conventional cold plate and AETB cold plate were 0.25 inches thick and had a cooling flow length of 6 inches.

Results from the testing showed that to maintain an average cold plate temperature of 115° F., the conventional cold plate needed 3 lb/min of cooling air compared to only 1 lb/min for the AETB cold plate. The AETB cold plate lowered the required coolant flow rate by a factor of 3. This represents a significant reduction in the air vehicle system penalty associated with the ECS. If strips of AETB ceramic foam had been utilized in the test rather than a continuous piece of foam, the required flow rate would have been even further reduced. As described below, reducing the flow length reduces the required coolant pressure. For the flow rate tested, the velocity of cooling air flowing through a 0.25 inch flow length is approximately twice as high as the velocity of air flowing through a 6 inch flow length. Higher flow velocities equate to higher heat transfer.

The small pores found in the foam strips 10 cause rarefaction of the flow through the material which advantageously minimizes pressure drop. Rarefaction occurs because the flow channel size approaches the mean free path of the individual air molecules in the coolant flow. This means that the flow can no longer be considered as a continuum and instead must be considered in terms of the path of individual particles through a channel. Rarefaction ultimately results in a non-zero "slip" velocity at the walls bounding a channel and an attendant reduction in pressure drop for the flow, compared to what would be expected for continuum flow and a no-slip boundary. This behavior was seen in testing of the cold plate 10, as shown in FIG. 4.

Figure 4:
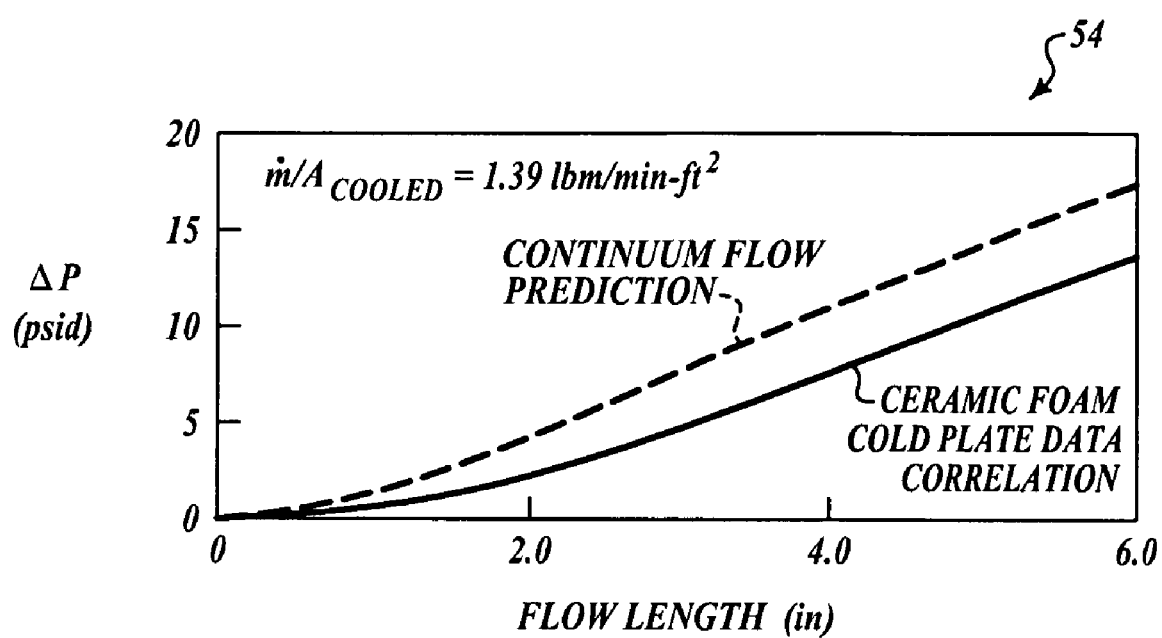
FIG. 4 is a graph of pressure drop versus flow length for an exemplary ceramic foam cold plate.

Referring now to FIG. 4, a graph 54 plots pressure drop versus flow length. The slip flow produced by rarefaction in the foam strip 18 reduces the pressure drop by 20 percent to 50 percent compared to what would be expected under the continuum flow assumption. The graph 54 also indicates that pressure drop for cooling lengths (that is, the width w of the foam strip 18) under approximately 1 inch are comparable to conventional cold plate pressure drop. This reduction in pressure drop due to small pore rarefaction along with the extremely high internal surface area already discussed work in concert to provide the cold plate 10 with convective heat transfer capabilities far superior to currently known metal foam or finned cold plates.

Figure 5A:
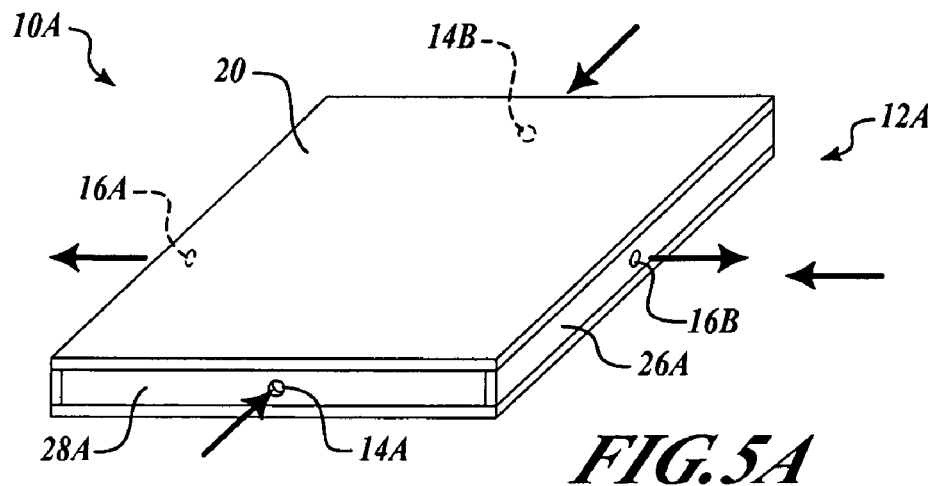
FIG. 5A is a perspective view of another exemplary ceramic foam cold plate.
Figure 5B:
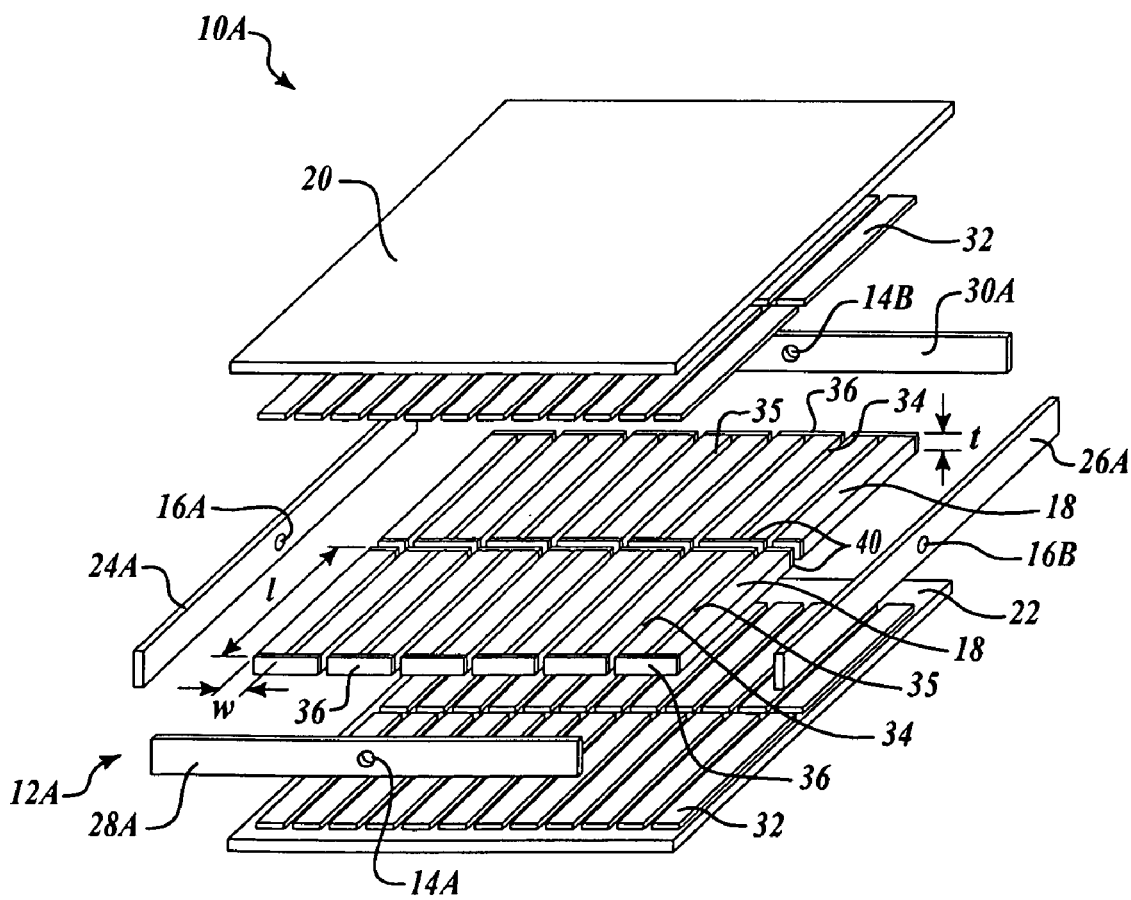
FIG. 5B is an exploded perspective view of the exemplary ceramic foam cold plate of FIG. 5A.

Referring now to FIGS. 5A and 5B, another exemplary cold plate 10A includes the foam strips 18. The cold plate 10A is well-suited for use in applications, such as heat exchangers, that entail larger heat transfer surface areas than do printed circuit boards. Thus, the cold plate 10A may also be referred to as a heat exchanger plate. Cooling air is introduced on each end of the cold plate 10A to maximize cooling efficiency by minimizing the temperature rise experienced by the cold plate 10A. To that end, a housing 12A defines inlet ports 14A and 14B and outlet ports 16A and 16B, and two pluralities of the foam strips 18 are disposed in the housing 12A. The foam strips 18 have been discussed in detail above. The pluralities of foam strips 18 are arranged within the housing 12A such that coolant flows through a width w of the foam strips 18 as discussed above in connection with FIG. 1C.

Still referring to FIGS. 5A and 5B, the housing 12A is made of the top and bottom cover plates 20 and 22, side plates 24A and 26A, and end plates 28A and 30A. The end plate 28A defines the inlet port 14A and the end plate 30A defines the inlet port 14B for receiving the coolant as described above. The side plate 24A defines the outlet port 16A and the side plate 26A defines the outlet port 16B for discharging the coolant from the cold plate 10A. The thermal sealant 32 physically connects the top cover plate 20 with the foam strips 18 and the bottom cover plate 22 with the foam strips 18.

In the same manner as described above in connection with FIG. 1C, the end caps 36 are attached to ends of the foam strips 18 near the inlet ports 14A and 14B and the end caps 40 are attached to the other ends of the foam strips 18. Thus, coolant flows into the inlet ports 14A and 14B, is channeled into the inlet plenums 34, flows through the widths of the foam strips 18, is channeled through the outlet plenums 35, meets in the mid-plane of the cold plate 10A, splits, and is discharged from the cold plate 10A via the outlet ports 16A and 16B.

Figure 6:
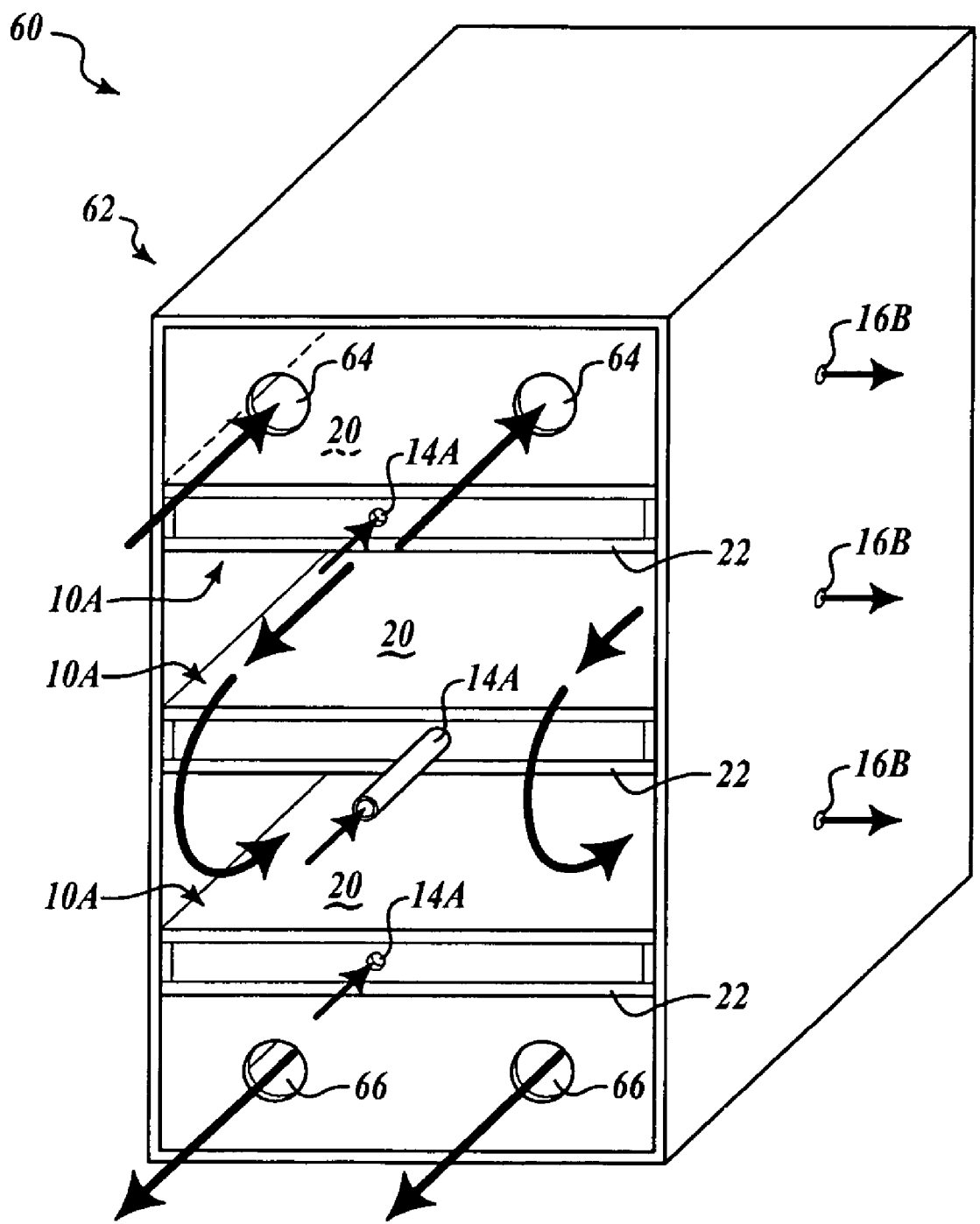
FIG. 6 is a perspective view in partial schematic form of an exemplary heat exchanger.

Referring now to FIG. 6, the cold plate 10A is especially well-suited for use as a heat exchanger plate in an exemplary heat exchanger 60. However, the cold plate 10 (FIGS. 1A-1C) may also be used as a heat exchanger plate in the heat exchanger 60, depending upon the cooling requirements placed upon the heat exchanger 60.

The heat exchanger 60 is a multiple pass heat exchanger. In an exemplary, non-limiting application, the heat exchanger 60 may use ram air from outside an aircraft to cool the air used for avionics cooling. Other aerospace applications for the heat exchanger 60 may include cooling engine oil/fuel and condensing ECS refrigerant. A heat exchanger housing 62 defines inlet ports 64 for receiving the fluid needing cooling, and outlet ports 66 for discharging the cooled fluid. The heat exchanger plates 10A are mounted within the housing 62 between the inlet ports 64 and the outlet ports 66 so the fluid needing cooling flows directly over the top cover plate 20 and the bottom cover plate 22 of the heat exchanger plates 10A mounted within the housing 62. Heat from the fluid entering the inlet ports 64 of the heat exchanger plates 10A is transferred to the coolant (or fluid) which enters the heat exchanger plate via inlet port 14A. The heated coolant (or fluid) is discharged from the heat exchanger plates 10A via the outlet ports 16B. As a result of the superior cooling capabilities of the heat exchanger plates 10A, the heat exchanger 60 can provide the same amount of cooling as conventional heat exchangers but at greatly reduced system penalties. This is because the heat exchanger 60 could be more compact and lighter weight than conventional heat exchangers.

While a number of exemplary embodiments and aspects have been illustrated and discussed above, those of skill in the art will recognize certain modifications, permutations, additions, and sub-combinations thereof. It is therefore intended that the following appended claims and claims hereafter introduced are interpreted to include all such modifications, permutations, additions, and sub-combinations as are within their true spirit and scope.

What is claimed is:

1. A method of cooling, comprising:
    receiving a flow of coolant at a first end of a channel between a pair of foam strips, wherein the foam strips present continuous surfaces between the first end of the channel and a second end of the channel wherein the pair of foam strips are positioned to absorb heat from an adjacent heat source;
    blocking the flow of coolant at the second end of the channel opposite the first end; and
    forcing the flow of coolant to pass through a plurality of pores in a section of at least one of the foam strips,
    wherein at least a portion of the heat absorbed by the at least one of the foam strips is transferred to the flow of coolant as the flow of coolant passes through the section of the at least one of the foam strips.

2. The method of claim 1, wherein the pair of foam strips are contained in a housing, wherein the housing is configured to receive the heat from the adjacent heat source and to conduct the heat to the pair of foam strips, and wherein the housing is configured to force the flow of coolant through the pair of foam strips.

3. The method of claim 1, wherein the pair of foam strips have a pore size of not more than around 50 micrometers and a porosity of at least around 80 percent.

4. A cooling apparatus comprising:
    a housing, wherein the housing includes a first plate, a second plate, and a plurality of sides, wherein the first plate, the second plate, and the plurality of sides define a volume within the housing, wherein at least one of the first plate and the second plate thermally engages a heat source;
    an inlet formed in the housing to receive a flow of coolant;
    an outlet formed in the housing to pass a flow of exhaust coolant; and
    one or more foam members extending between the first plate and the second plate within the housing, wherein the one or more foam members are thermally conductive to conduct heat received via one of the first plate and the second plate from the heat source, wherein each of the one or more foam members presents a continuous surface that defines at least one inlet plenum configured to receive the flow of coolant from the inlet and at least one outlet plenum configured to pass the flow of coolant to the outlet as the exhaust coolant, and wherein the flow of coolant received in the inlet plenum is forced to flow through a section of at least one of the one or more foam members to reach the outlet plenum.

5. The cooling apparatus of claim 4, wherein the one or more foam members have a pore size of not more than around 50 micrometers.

6. The cooling apparatus of claim 5, wherein the pore size is around 35 micrometers.

7. The cooling apparatus of claim 4, wherein the one or more foam members have a porosity of at least around 80 percent.

8. The cooling apparatus of claim 7, wherein the porosity is around 90 percent.

9. A cold plate comprising:
a housing, wherein the housing includes an upper plate, a lower plate, and a plurality of sides, wherein the upper plate is generally parallel to the lower plate, and wherein the plurality of sides contain a volume between the upper plate and the lower plate;
an inlet port formed in a first side of the plurality of sides, wherein the inlet port is configured to receive a flow of coolant;
an outlet port formed in a second side of the plurality of sides, wherein the outlet port is configured to exhaust a flow of used coolant;
a first foam strip and a second foam strip positioned in the volume to form at least one inlet channel region accessible to the inlet port and at least one outlet channel region accessible to the outlet port, wherein the first foam strip and the second foam strip generally extend from the lower plate to the upper plate; and
at least one end cap, wherein the at least one end cap is positioned at an end of the first foam strip and the second foam strip to separate the at least one inlet channel region and from the at least one outlet channel region,
wherein the first foam strip and the second foam strip present continuous surfaces that extend from the inlet port to the at least one end cap and that extend from the lower plate to the upper plate so that the flow of coolant entering the inlet port is forced to flow from the at least one inlet channel region through a section of at least one of the first foam strip and the second foam strip to reach the at least one outlet channel region.

10. The cold plate of claim 9, wherein the first foam strip and the second foam strip include ceramic foam.

11. The cold plate of claim 10, wherein the ceramic foam includes silica, aluminum oxide, and aluminum borosilicate fibers.

12. A cooling apparatus comprising:
a surface configured to be disposed against a body to be cooled;
a first continuous foam strip having a first end and a second end, wherein at least one edge between the first end and the second end of the first continuous foam strip is disposed against the surface;
a second continuous foam strip having a first end and a second end, wherein at least one edge between the first end and the second end of the second continuous foam strip is disposed against the surface, and wherein the second continuous foam strip is spaced apart from the first continuous foam strip to form a channel region configured to receive a flow of fluid to cool the body; and an end cap coupling the second end of the first continuous foam strip to the second end of the second continuous foam strip, wherein the end cap closes the channel region at the second end of the first continuous foam strip and at the second end of the second continuous foam strip.

13. The cooling apparatus of claim 12, wherein the first continuous foam strip and the second continuous foam strip are porous, wherein the first continuous foam strip and the second continuous foam strip allow the fluid in the channel region to pass through the first continuous foam strip and the second continuous foam strip.

14. The cooling apparatus of claim 13, wherein the first continuous foam strip and the second continuous foam strip have a pore size of not more than around 50 micrometers and a porosity of at least around 80 percent.

15. The cooling apparatus of claim 14, wherein the pore size of is around 35 micrometers.

16. The cooling apparatus of claim 14, wherein the porosity is around 90 percent.

17. The cooling apparatus of claim 12, wherein the end cap is impermeable to the fluid.

18. The cooling apparatus of claim 17, wherein the first continuous foam strip, the second continuous foam strip, and the channel region are enclosed in a housing, wherein the flow of the fluid passes through at least one of the first continuous foam strip and the second continuous foam strip to exit the channel region.

19. The cooling apparatus of claim 12, wherein the first continuous foam strip and the second continuous foam strip include ceramic foam.

20. The cooling apparatus of claim 19, wherein the ceramic foam includes silica, aluminum oxide, and aluminum borosilicate fibers.

21. A cooling apparatus comprising:
a first continuous foam strip having a first end, a second end, a top, and a bottom;
a second continuous foam strip having a first end, a second end, a top, and a bottom, wherein the second continuous foam strip is positioned with the first end of the second continuous foam strip positioned apart from the first end of the first continuous foam strip and the second end of the second continuous foam strip positioned apart from the second end of the first continuous foam strip to form a channel region configured to receive a flow of fluid;
a housing, wherein the housing includes a top cover plate that extends across the channel region and across the top of the first continuous foam strip and across the top of the second continuous foam strip and a bottom cover plate that extends across the channel region and across the bottom of the first continuous foam strip and across the bottom of the second continuous foam strip, and wherein at least one of the top cover plate and the bottom cover plate is configured to be disposed against a body to be cooled by the flow of fluid; and
an end cap, wherein the end cap extends between the second end of the first continuous foam strip and the second end of the second continuous foam strip, wherein the flow of fluid received into the channel region is forced to flow through at least one of the first continuous foam strip and the second continuous foam strip to pass out of the channel region.

22. The cooling apparatus of claim 21, wherein the housing comprises one or more side walls extending between the top cover plate and the bottom cover plate.

23. The cooling apparatus of claim 22, further comprising one or more additional caps joining the first end of the first continuous foam strip and the first end of the second continuous foam strip to one of the one or more side walls of the housing or to a first end of an additional foam strip, wherein an interior of the housing is separated into an inlet plenum including the channel region and an outlet plenum.

24. The cooling apparatus of claim 23, wherein the inlet plenum includes an inlet port and outlet plenum includes an outlet port.

25. The cooling apparatus of claim 23, wherein the first continuous foam strip and the second continuous foam strip are joined to the top cover plate and the bottom cover plate with a thermal sealant.

26. The cooling apparatus of claim 23, wherein the flow of fluid can only pass from the inlet plenum to the outlet plenum through at least one of the first continuous foam strip and the second continuous foam strip.

27. The cooling apparatus of claim 21, wherein the first continuous foam strip and the second continuous foam strip have a pore size of not more than around 50 micrometers and a porosity of at least around 80 percent.

* * * * *